United States Patent [19]

Cunningham et al.

[11] 3,996,655

[45] Dec. 14, 1976

[54] PROCESSES OF FORMING INSULATED GATE FIELD EFFECT TRANSISTORS WITH CHANNEL LENGTHS OF ONE MICRON IN INTEGRATED CIRCUITS WITH COMPONENT ISOLATED AND PRODUCT

[75] Inventors: James A. Cunningham, Santa Clara, Calif.; James E. Schroeder, Houston, Tex.; Mark Roman Guidry, Escondido, Calif.

[73] Assignee: Texas Instruments Incorporated, Dallas, Tex.

[22] Filed: Aug. 25, 1975

[21] Appl. No.: 607,526

Related U.S. Application Data

[63] Continuation of Ser. No. 424,997, Dec. 14, 1973, abandoned.

[52] U.S. Cl. .................................. 29/571; 29/578; 357/23; 357/58
[51] Int. Cl.[2] .......................................... B01J 17/00
[58] Field of Search ............... 29/576, 578; 357/23, 357/48, 58

[56] References Cited

UNITED STATES PATENTS 3,766,446  10/1973  Tarui ................................... 357/43

Primary Examiner—W. Tupman
Attorney, Agent, or Firm—Harold Levine; Rene E. Grossman; John G. Graham

[57] ABSTRACT

The disclosure relates to methods of forming Insulated Gate Field Effect transistors and the product suitable for integrated circuits with channel lengths of 1 micron or less, the transistors being isolated from other transistors or other components in the circuit without the requirements of extra isolation steps. This is provided by means of a double diffusion which isolates the channel of the transistor from other elements in the circuit. Channel length is solely a function of the diffusion schedule through openings in the oxide through which the double diffusion takes place.

4 Claims, 29 Drawing Figures

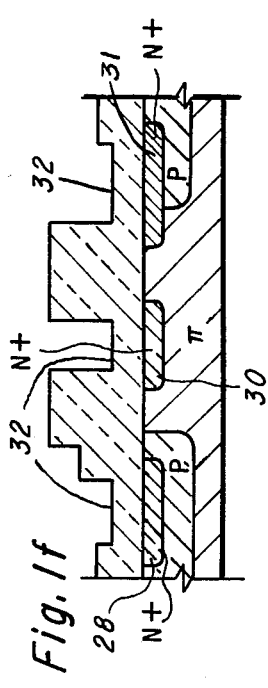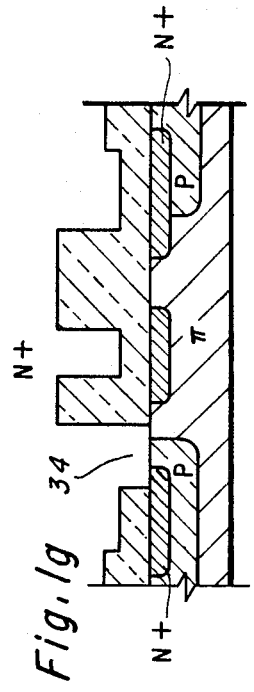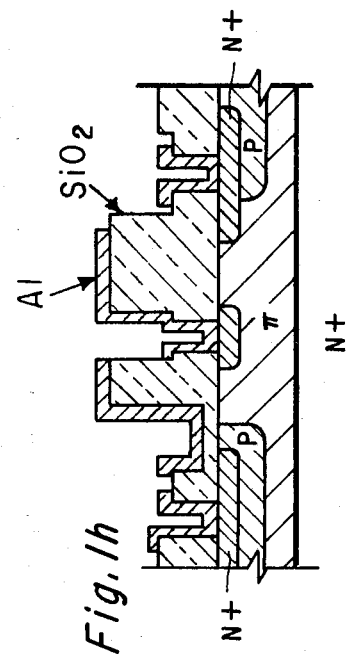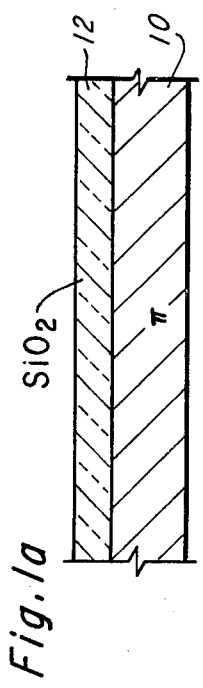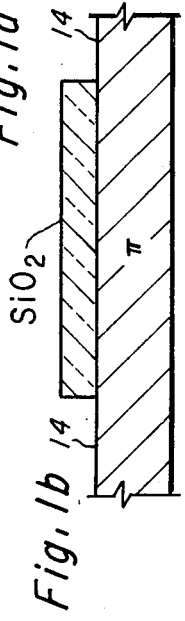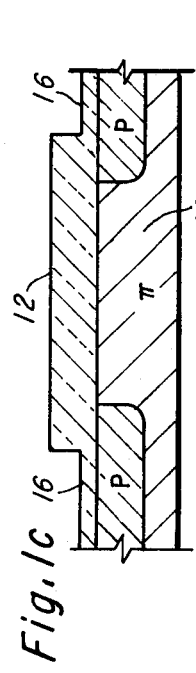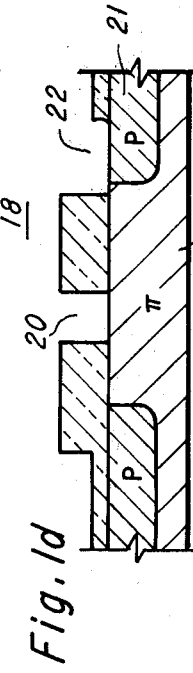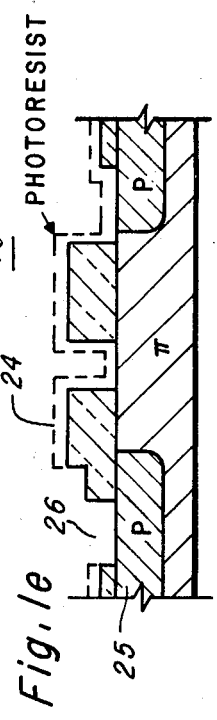

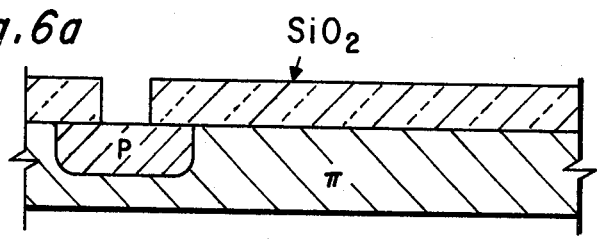
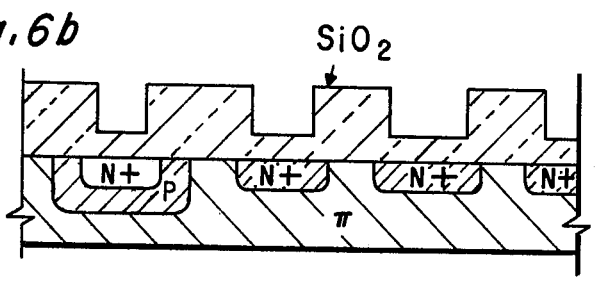
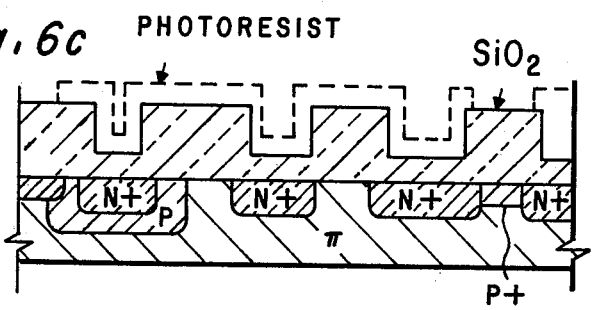
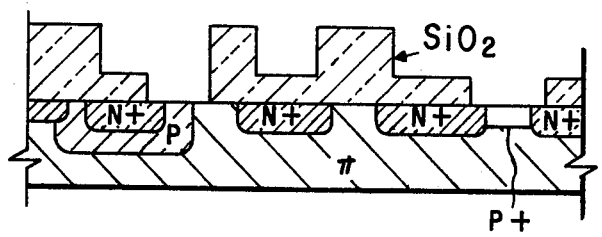

PROCESSES OF FORMING INSULATED GATE FIELD EFFECT TRANSISTORS WITH CHANNEL LENGTHS OF ONE MICRON IN INTEGRATED CIRCUITS WITH COMPONENT ISOLATED AND PRODUCT

This is a continuation of application Ser. No. 424,997 filed Dec. 14, 1973, now abandoned.

This invention relates to a process for fabrication of Insulated Gate Field Effect transistors (IGFET) for integrated circuits which channel lengths of about 1 micron or less which are isolated from other components in the curcuit and the product thereof, and, more specifically, to the isolation of such a transistor from other components in the integrated circuit without additional processing steps.

It is well known in the art that the frequency response or speed of an IGFET(commonly referred to as an MOS transistor) is determined primarily by the channel length and parasitic capacitance, the frequency response or speed improving as the channel length and parasitic capacitance are reduced in value. The reduction in the channel length cuts the transit time for carriers travelling between source and drain, while reduction of the capacitance will decrease the charging time. The problem encountered in the prior art has been that short channel lengths were normally coupled with large parasitic capacitances because the separation between source and drain determines the amount of lateral diffusion under the gate for a given channel length, and the lateral diffused region, which is also highly doped, represents a large capacitance between gate and source or gate and drain. While these parasitic capacitances can be minimized by several techniques such as ion implantation and polysilicon gate processes, these techniques are relatively expensive and more economical fabrication techniques would be advantageous. Furthermore, MOS transistors that are conventionally processed with short channel length exhibit breakdown at low voltages.

The prior art has overcome this problem in part by means of a double/diffused MOS transistor, also known as D/MOS whch is described in an article entitled "Double-Diffused MOS Transistor Achieves Microwave Gain", Electronics, Feb. 15,1971, by T. Cange, J. Koisic, H. J. Sigg and G. B. Dendelin. The D/MOS process involves a double diffusion at the source region and single diffusion of both of the drain regions within a substantially intrinsic or very lightly doped substrate. The details of the fabrication of the D/MOS transistor in accordane with the above noted publication are to first grow 15, 1971oxide on a substrate of starting material which can be n-, p-, or $\pi$ substrate type. The oxide is then opened and a first p-type region channel is diffused herein. The drain regions are now opened and n+ material is diffused into the source and drain regions in an oxidizing atmosphere as in conventional MOS fabrication. The diffusion through the original channel opening forms the required source diffusion. This provides a narrow p-type channel adjacent to the source with an extended drift region in the substrate material to the drain, thereby providing a 1-micron or less channel length. The processing is completed utilizing standard MOS technology procedures.

It is apparent that the above described D/MOS transistor, while overcoming many of the problems of the prior art, can only be produced as a discrete transistor element. Fabrication thereof in an integrated circuit would require additional isolation steps to isolate the drain regions from other components in the circuit.

In accordance with the present invention, there is provided a method of fabricating MOS transistors in integrated circuits wherein isolation is provided utilizing no more steps than is provided in the prior art D/MOS system or providing discrete micron channel transistors. Briefly, this is accomplished by providing the subsrate of $\pi$, p -or n material and forming an oxide on the surface thereof. The oxide is then opened at the drain regions to provide a p-type diffusion. The region where the source will be formed is then opened up in addition to the regions over the p-type drains and an n+ type diffusion is then provided with proper diffusion scheduling to provide three n+ type regions, two of the regions formed within the p-tvpe regions previously diffused. The result is a driver coupled to a load, the driver-load combination being isolated from other components in the substrate by the large p-type region surrounding both of the drain regions.

It is therefore an object of this invention to provide a micron channel transistor which is isolated from other components on the substrate.

It is a further object of this invention to provide a method of forming a micron channel MOS transistor which is isolated from other components on a substrate without requiring additional processing steps.

The above objects and still other objects of the invention will immediately become apparent to those skilled in the art after consideration of the following preferred embodiments thereof, which are provided by way of example and not by way of limitation wherein:

FIG. 1a–1h is a diagram showing the process steps required to form isolated MOS transistor in accordance with a first embodiment of the prevent invention;

Figure 2A:
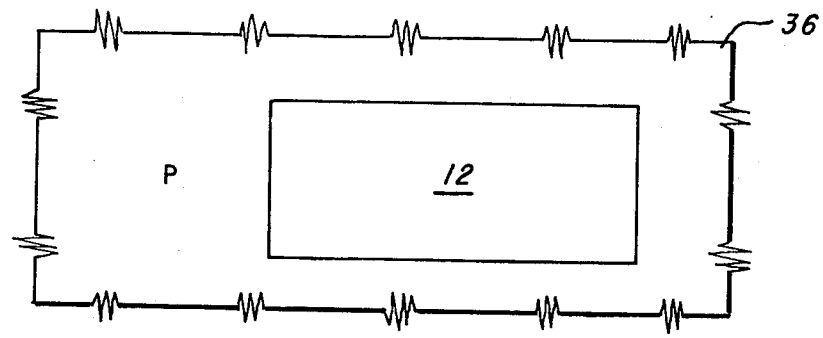
FIG 2a–2c is a top view of an MOS transistor formed by the method of FIG. 1a–1h after different steps in the formation process

FIG. 6a–6d is a diagram showing the process steps required to form isolated MOS transistors in according with a second embodiment of the present invention; and FIG. 7a–7e is a diagram showing the process steps required to form isolated MOS transistors in accordance with a third embodiment of the present invention. de Referring first to FIG. 1, there is shown the series of processing steps for forming an isolated MOS micron channel transistor according to one embodiment of the present invention. FIG. 1a shows the initial starting substrate 10 which can be of $\pi$, p- or n- silicon. A silicon dioxide layer 12 is formed on the upper surface of the substrate. The oxide is then removed in the region 14 where the drain electrodes are to be formed as shown in FIG. 1b and a p-type difussion takes place in the region where the oxide has been removed. This is shown in detail in FIG. 2a. Oxide 16 is then formed over the diffused regions as shown in FIG. 1c. The p-type diffused region extends laterally under the silicon dioxide layer 12 at this time. It can be seen from FIG. 2 a that the p-type diffused region extends completely around the substrate portion adjacent the oxide layer 12, thereby isolating this surface portion 18 (FIG. 1c from other portions of the substrate and providing the final isolation of the MOS transistor being formed from other components formed in the substrate.

Figure 2B:
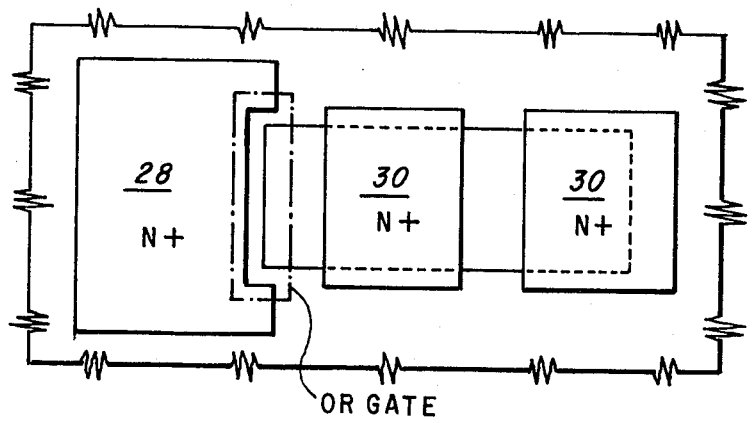
Figure 2C:
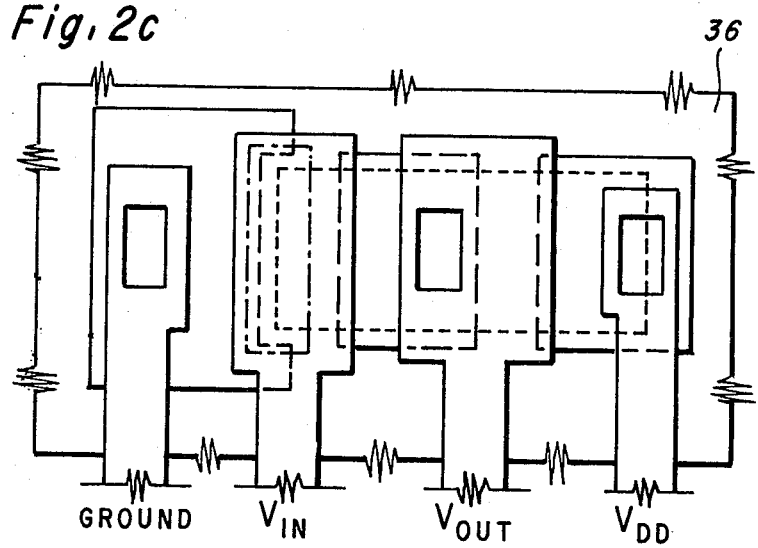

Turning now to FIG. 1d, oxide has been removed in the region 20 to expose the substrate 10 where the source will be formed as well as in the region 22 to expose one of drain regions 21. With reference to FIG. 1e, a photoresist layer 24 is now placed over the regions from which oxide has just been removed and the oxide is also removed over a central portion 26 of the remaining p-type region 25. It will be noted that the first oxide removal over the p-type region 21 in FIG. 1d actually extends over a portion of the substrate region 18 whereas the second oxide removal over the p-type region 25 in FIG. 1e is completely over the p-type region and does not extend over the $\pi$-type substrate material. The photoresist 24 is now removed and n+-type diffusions 28, 30 and 31 takes place through each of the openings 26, 20, and 22 in the oxide as shown in FIG. 1f. This provides the formation of a small channel at the surface in the p-type region 25 between the boundaries of the n+ region 28 and the p-type region 25. The length of this channel is determined by the diffusion scheduling of the n+-type region 28 and can be of 1 micron length or less. The region in the $\pi$ type substrate between the p-type region 25 and the diffusion 30 is a drift region or virtual drain and is not part of the channel itself. Oxide 32 is then formed over the last diffused regions as also shown in FIG. 1 f and then a further oxide removal in region 34 takes place for later location of the gate electrode. This is shown in FIG. 1 g. A top view of a portion of the substrate after the process steps of FIG. 1 g is shown in FIG. 2 b wherein the further cross hatch portion depicts the n+-type diffusions and the bracketed portion depicts the oxide removal for positioning of the gate electrode. After further oxide removal for exposing source and drain regions and metallization for forming source, drain and gate contacts, the final structure is provided as shown in FIG. 1 h. A top view of the structure is also shown in FIG. 2 c.

It can be seen that there has been provided as MOS transistor having a micron length channel as most clearly shown in FIG. 1 g. Regions 30 and 32 define source and drain regions for a second MOS transistor which can be a load device. The inverter structure shown in FIG. 1 c is isolated by means of the p-type region 36 which surrounds the transistor and load.

Figure 3A:
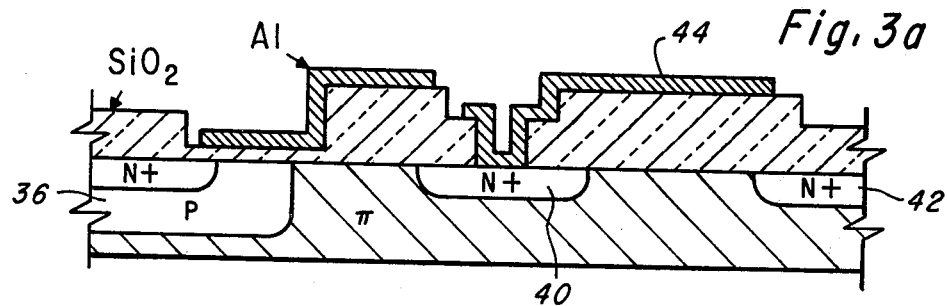
FIG. 3a–3c is a cross-sectional view of several circuit devices formed by the process of FIG. 1a–1h.
Figure 3B:
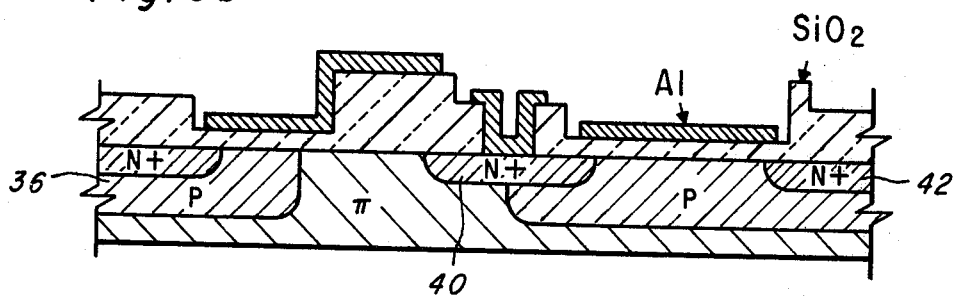
Figure 3C:
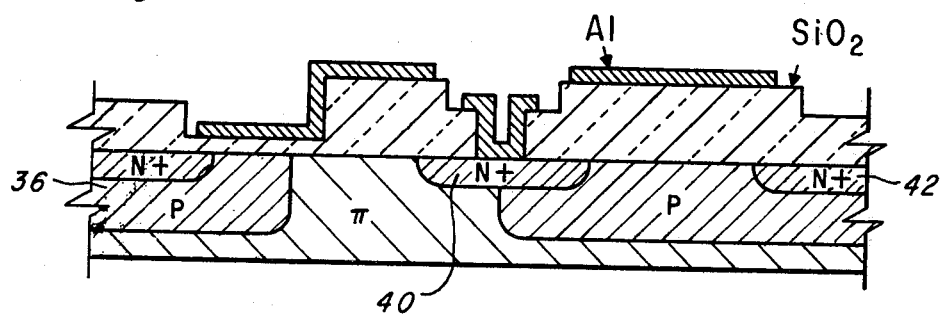

Referring now to FIG. 3, there is illustrated a structure that includes several MOS devices that can be fabricated in a substrate while simultaneously providing the desired isolation from other components in the substrate as described above. FIG. 3 aillustrates the final structure of a MOS transistor with a depletion mode load as formed in accordance with the invention. The load transistor is formed by source region 40 and drain 42; the gate 44 is tied to the source 40. The p-type diffused regions 36 will extend around the entire structure as shown with regard to the embodiment of FIG. 2 a in the same manner to provide the isolation. This is also true for the enhancement load clock transistor in FIG. 3 b wherein again the p-type diffused regions provide the isolation from remaining circuitry on the substrate area. FIG. 3 c shows a thick oxide transistor which can be formed using substantially the same type of process as disclosed above with regard to the formation of the inverter stage of FIGS. 1 and 2.

Figure 4A:
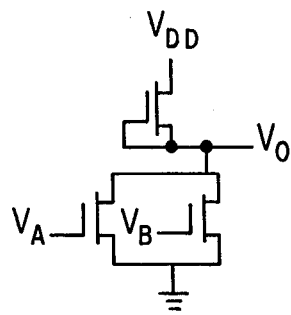
FIG. 4 (a) is a circuit diagram of NOR gate.
FIG. 4b is a cross-sectional view of the NOR gate of FIG. 4a formed by the process of FIG. 1a–1h.
FIG. 4c is a top view of the NOR gate of FIG. 4b.
Figure 4B:
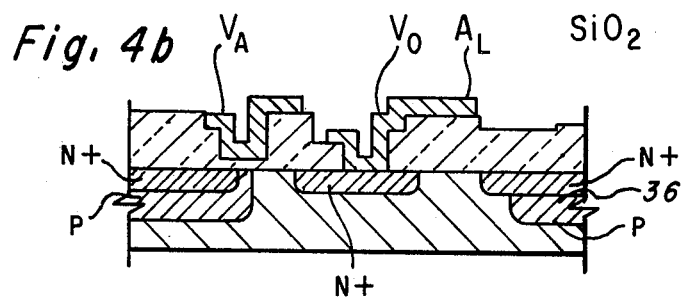
Figure 4C:
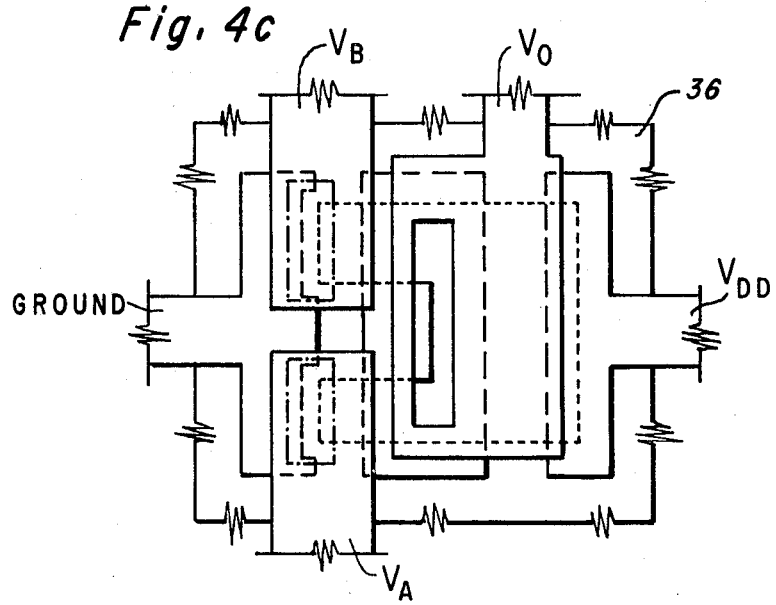

Because of the isolation provided by the method of the present invention, logic gates with either series or parallel connected devices can be fabricated. Referring to FIG. 4, there is shown a two input NOR gate, it being understood that the number of inputs can be of any desired number since the transistors are positioned in parallel. It can be seen in FIG. 4 a that an output is provided when either of the transistors with inputs VA or VB is energized. FIG. 4 b is a cross-sectional view taken through the transistor with input VA only and FIG. 4 c is a top view of the final structure to provide the circuit equivalent shown in FIG. 4c. It can again be seen with reference of FIGS. 4 b and 4 c that the micron channel NOR gate provided is isolated from other circuitry on the $\pi$-type substrate, thereby allowing the formation of the NOR gate with merely two diffusion steps.

Figure 5A:
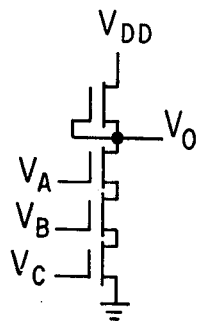
FIG. 5a is a curcuit diagram of a NAND gate.
Figure 5B:
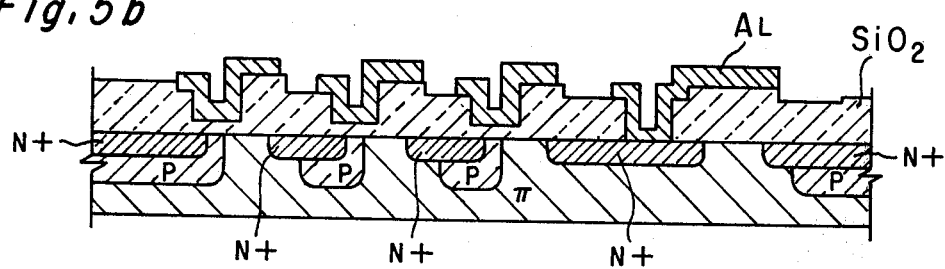
FIG. 5b is a cross-sectional view of the NAND gate of FIG. 5a formed by the process of FIG. 1a–1h.
Figure 5C:
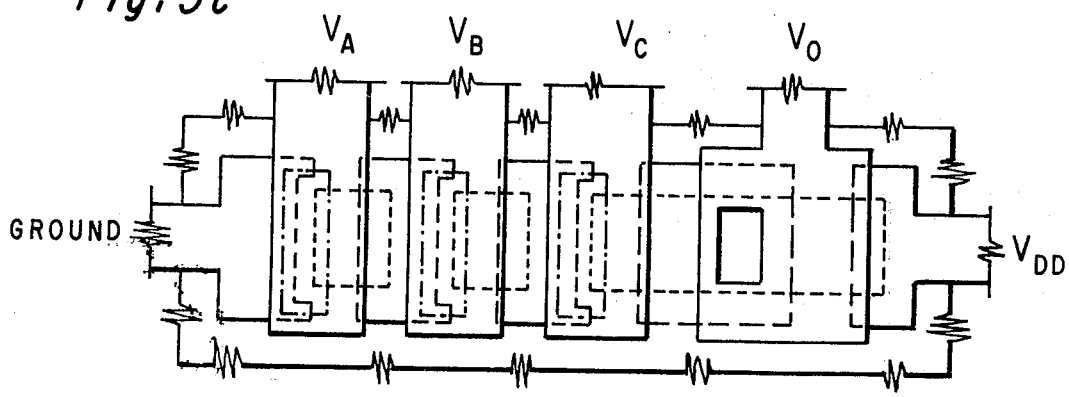
FIG. 5c is a top view of the NAND gate of FIG. 5b.
Figure 7A:
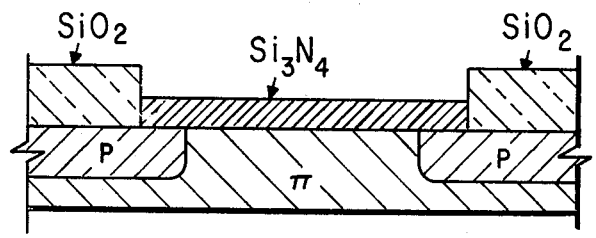
Figure 7B:
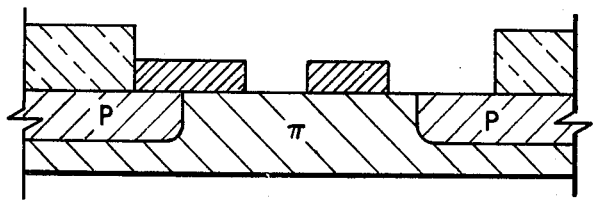
Figure 7C:
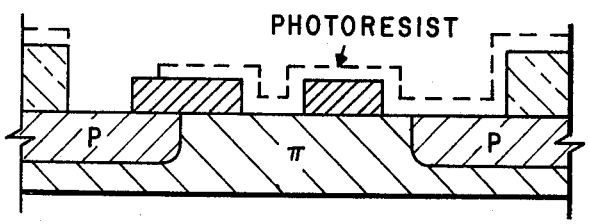
Figure 7D:
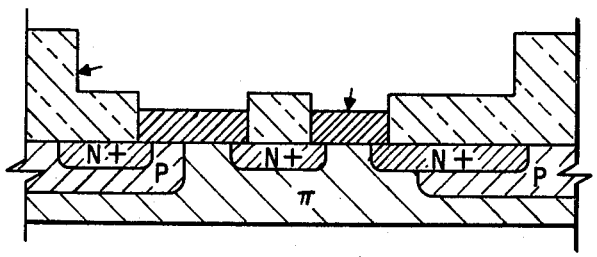
Figure 7E:
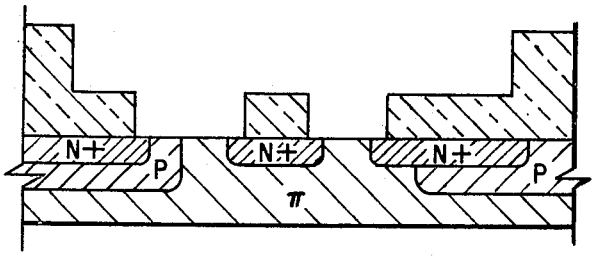

Referring now to FIG. 5, there is shown a micron channel NAND gate with depletion load. This is made possible by the serial connection of transistors having inputs VA, VB and VC as shown in FIG. 5 a. The actual physical embodiment for positive logic is shown in cross-section in FIG. 5 b and a top view is shown in FIG. 5 c. It can be seen with reference to FIGS. 5 b and 5 c that the NAND gate is isolated from other circuits on the $\pi$-type substrate by means of the extreme p-type diffused regions in the same manner as described above.

Referring now to FIG. 6, there is shown an alternate method of isolating the various transistors in the substrate. While some of the steps herein have been combined and others omitted, it can be seen that the process begins with an $\pi$, p- or n- type substrate with a silicon oxide layer thereon. A portion of the silicon dioxide layer is removed and a p-type diffusion takes place within the region of oxide removal as shown in FIG. 6 a. Then oxide is removed from further regions along the silicon dioxide layer and an n+-type diffusion is provided in all the regions from which the oxide has been removed including over the original p-type region as shown in FIG. 6 b. Oxide is then formed over each of the n+-type diffusion regions again as shown in FIG. 6 b or the n+-type diffusion initially take place in an oxidizing atmosphere. The oxide is then masked with a photoresist in all regions except one region between a pair of the n+ regions to the right and to the extreme left as shown in FIG. 6 c. P-type ions are then implanted along the surface of the substrate between the two right most n+ regions as shown in FIG. 6 c and the extreme left to provide a shallow p+-type isolation layer, the implanation taking place through the unmasked regions. The substrate is then subjected to oxide removal for proper positioning of gate, source and drain electrodes as shown in FIG. 6 d. The process shown in FIG. 6 d are followed by gate oxidation, contact oxide removal, metallization and metal removal as is well known in the art and provides the final inverter stage. Again, it can be seen that only two diffusions are necessary to provide the necessary isolation of the inverter stage in FIG. 6 from other circuitry on the substrate.

Referring now to FIG. 7, there are shown the processing steps for fabricating planar diffused micron channel MOS transistor wherein a nitride layer or a silcon dioxide/silicon nitride sandwich is formed over a substrate of π, p- or n-type material. A portion of the silicon nitride is removed and a p-type diffusion takes place in the removal areas with a subsequent oxidation thereof to provide the structure as shown in FIG. 7 a. Oxide is then removed at selected areas along the silicon nitride layer with also removal of a portion of a silicon dioxide over the p-type region formed to the right to provide the structure as shown in FIG. 7 b. A photoresist is then formed over the device as shown in FIG. 7 c with the exception of a region over the center of the left-hand p-type diffusion wherein oxide is removed. The photoresist is then removed and an n+-type diffusion takes place in each of the areas from which oxide and/or nitride has been removed to provide the n+-type regions as shown in FIG. 7 d. Oxide is then formed over the n+regions to provide the final structure as shown in FIG. 7 d. The remaining nitride is then removed as shown in FIG. 7 e and this is then followed by the necessary oxidation for the gate electrode, removal of silicon dioxide for formation of contacts in the source and drain location followed by metallization and metal removal is standard matter to provide the final structure. It can then be seen with reference to FIG. 7 e that the inverter stage as finally formed is completely isolated from other components on the chip.

It can be seen that there has been provided a method and product wherein MOS transistors can be formed on a substrate with isolation thereof from other components on a substrate and without the requirement of additional processing steps over prior art method.

Though the invention has been described with respect to specific preferred embodiments thereof, many variations and modifications thereof will immediately become apparent to those skilled in the art. It is therefore the intention that the appended claims be interpreted as broadly as possible in view of the prior art to include all such variations and modifications.

What is claimed is:
1. A method of forming MOS transistors for integrated circuits which comprises the steps of:
 a. forming a closed first region of predetermined conductivity type in a major face of a substantially intrinsic substrate, said first region surrounding a central area where the material of said substrate is exposed at said major face,
 b. forming in said major surface second and third regions of conductivity type opposite to said first region, the second region being within said first region and said third region being in said central area and spaced apart from said second region, the second and the third regions providing the source and drain regions of an MOS transistor
 c. forming an insulating layer over an area of at least said first and second regions to provide a gate insulator for an MOS transistor, the semiconductor material beneath the insulating layer providing the channel of an MOS transistor and
 d. forming conductive contacts to said second and third regions to provide source and drain connections in MOS transistor and on said insulating layer to provide a gate connection to an MOS transistor.

2. A method of forming MOS transistors as set forth in claim 1 wherein said substrate is taken from the class consisting of π, p- and n-type silicon.

3. A method of forming MOS transistors as set forth in claim 1 wherein said closed region is of p-type conductivity.

4. A method of forming MOS transistors as set forth in claim 2 wherein said closed region is of p-type conductivity.

* * * * *